United States Patent
Skinner et al.

(10) Patent No.: US 9,601,468 B2
(45) Date of Patent: Mar. 21, 2017

(54) MAGNETIC CONTACTS

(71) Applicant: Intel Corporation, Santa Clara, CA (US)

(72) Inventors: Michael P. Skinner, San Jose, CA (US); Teodora Ossiander, Sinzing (DE); Sven Albers, Regensburg (DE); Georg Seidemann, Landshut (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/146,811

(22) Filed: May 4, 2016

(65) Prior Publication Data

US 2016/0247785 A1 Aug. 25, 2016

Related U.S. Application Data

(60) Division of application No. 14/827,056, filed on Aug. 14, 2015, now Pat. No. 9,343,389, which is a (Continued)

(51) Int. Cl.
*H01F 7/04* (2006.01)
*H01L 25/065* (2006.01)
(Continued)

(52) U.S. Cl.
CPC ........... *H01L 25/0657* (2013.01); *H01F 7/04* (2013.01); *H01L 23/32* (2013.01);
(Continued)

(58) Field of Classification Search
CPC .......................... H01L 2225/06531; H01F 7/04
See application file for complete search history.

(56) References Cited

U.S. PATENT DOCUMENTS 3,359,145 A   12/1967   Salyer et al.
3,762,946 A   10/1973   Stow et al.
(Continued)

OTHER PUBLICATIONS

White, M. "Separate the Hype from the Reality in 3D-ICs" electronicdesign.com article published online Jun. 15, 2012, http:electronicdesign.com/boards/separate-hype-reality-3d-ics.*
(Continued)

*Primary Examiner* — Matthew Landau
*Assistant Examiner* — Grant Withers
(74) *Attorney, Agent, or Firm* — Schwabe, Williamson & Wyatt, P.C.

(57) ABSTRACT

Embodiments of the present disclosure are directed to integrated circuit (IC) package assemblies with magnetic contacts, as well as corresponding fabrication methods and systems incorporating such magnetic contacts. A first IC substrate may have a first magnet coupled with a first electrical routing feature. A second IC substrate may have a second magnet coupled with a second electrical routing feature. The magnets may be embedded in the IC substrates and/or electrical routing features. The magnets may generate a magnetic field that extends across a gap between the first and second electrical routing features. Electrically conductive magnetic particles may be applied to one or both of the IC substrates to form a magnetic interconnect structure that extends across the gap. In some embodiments, magnetic contacts may be demagnetized by heating the magnets to a corresponding partial demagnetization temperature (PDT) or Curie temperature. Other embodiments may be described and/or claimed.

9 Claims, 10 Drawing Sheets

Related U.S. Application Data continuation of application No. 13/965,746, filed on Aug. 13, 2013, now Pat. No. 9,142,475.

(51) Int. Cl.
    *H01L 23/32*    (2006.01)
    *H01L 23/498*   (2006.01)
    *H01L 25/00*    (2006.01)
    *H01L 23/00*    (2006.01)

(52) U.S. Cl.
    CPC .. *H01L 23/49811* (2013.01); *H01L 23/49866* (2013.01); *H01L 24/13* (2013.01); *H01L 24/16* (2013.01); *H01L 24/81* (2013.01); *H01L 25/50* (2013.01); *H01L 2224/10135* (2013.01); *H01L 2224/10165* (2013.01); *H01L 2224/11332* (2013.01); *H01L 2224/11522* (2013.01); *H01L 2224/132* (2013.01); *H01L 2224/1336* (2013.01); *H01L 2224/13298* (2013.01); *H01L 2224/13355* (2013.01); *H01L 2224/13357* (2013.01); *H01L 2224/13444* (2013.01); *H01L 2224/13464* (2013.01); *H01L 2224/13469* (2013.01); *H01L 2224/1601* (2013.01); *H01L 2224/16225* (2013.01); *H01L 2224/16227* (2013.01); *H01L 2224/811* (2013.01); *H01L 2224/8114* (2013.01); *H01L 2224/81139* (2013.01); *H01L 2224/81193* (2013.01); *H01L 2225/06513* (2013.01); *H01L 2225/06527* (2013.01); *H01L 2225/06531* (2013.01); *H01L 2225/06568* (2013.01); *H01L 2225/06593* (2013.01); *H01L 2225/06596* (2013.01)

(56) References Cited

U.S. PATENT DOCUMENTS

| | | | |
|---|---|---|---|
| 4,170,677 | A | 10/1979 | Hutcheson |
| 4,548,862 | A | 10/1985 | Hartman |
| 4,644,101 | A | 2/1987 | Jin et al. |
| 4,737,112 | A | 4/1988 | Jin et al. |
| 5,346,775 | A * | 9/1994 | Jin .................. B23K 1/00 228/248.5 |
| 5,430,614 | A | 7/1995 | Difrancesco |
| 5,509,815 | A | 4/1996 | Jin et al. |
| 5,525,941 | A * | 6/1996 | Roshen ............ H01F 17/0006 257/E23.178 |
| 5,661,042 | A | 8/1997 | Fang et al. |
| 5,769,996 | A | 6/1998 | McArdle et al. |
| 5,786,979 | A | 7/1998 | Douglass |
| 5,916,641 | A | 6/1999 | McArdle et al. |
| 5,973,923 | A | 10/1999 | Jitaru |
| 5,975,922 | A | 11/1999 | Jin |
| 6,042,894 | A | 3/2000 | Goto et al. |
| 6,264,476 | B1 | 7/2001 | Li et al. |
| 6,325,552 | B1 | 12/2001 | Brillhart |
| 6,340,113 | B1 | 1/2002 | Avery et al. |
| 6,346,750 | B1 | 2/2002 | Jiang et al. |
| 6,524,115 | B1 | 2/2003 | Gates et al. |
| 6,574,114 | B1 | 6/2003 | Brindle et al. |
| 7,033,184 | B2 | 4/2006 | Cornell |
| 7,815,998 | B2 | 10/2010 | Simpson et al. |
| 8,482,107 | B2 | 7/2013 | Rokuhara et al. |
| 8,609,532 | B2 | 12/2013 | Swaminathan et al. |
| 8,623,265 | B2 | 1/2014 | Simpson |
| 8,701,973 | B2 | 4/2014 | Kuramoto et al. |
| 2005/0264307 | A1 | 12/2005 | Setaka |
| 2006/0091538 | A1 | 5/2006 | Kabadi |
| 2007/0023907 | A1 | 2/2007 | Fork et al. |
| 2007/0023909 | A1 | 2/2007 | Fork et al. |
| 2007/0134947 | A1 | 6/2007 | Neidlein |
| 2007/0177298 | A1 | 8/2007 | Jaatinen et al. |
| 2008/0258313 | A1 | 10/2008 | Ali et al. |
| 2010/0164671 | A1 | 7/2010 | Pagani et al. |
| 2011/0115078 | A1 | 5/2011 | Jeong et al. |
| 2011/0223776 | A1 * | 9/2011 | Ferber, Jr. ............ H05K 3/325 439/39 |
| 2011/0278351 | A1 | 11/2011 | Aleksov et al. |
| 2012/0313236 | A1 | 12/2012 | Wakiyama et al. |
| 2014/0246788 | A1 | 9/2014 | Kim et al. |
| 2014/0319702 | A1 | 10/2014 | Yang et al. |
| 2014/0327155 | A1 | 11/2014 | Kang et al. |

OTHER PUBLICATIONS

Non-Final Office Action mailed Dec. 24, 2014 in U.S. Appl. No. 13/965,746, filed Aug. 13, 2013, 22 pages.

Karnezos, M., "3-D Packaging: Where All Technologies Come Together" Elec. Manu. Tech. Symp. 2004 dated Jul. 16, 2004, pp. 64-67.

White, M.,"Separate the Hype From the Reality in 3D-ICs" electronicdesign.com article published online Jun. 15, 2012, http://electronicdesign.com/boards/separate-hype-reality-3d-ics.

Maxfield, C., "2D vs. 2.5D vs. 3D ICs 101" EETimes website article published online Apr. 8, 2012 and available at http://www.eetimes.com/document.asp?doc_id=1279540.

Notice of Allowance mailed May 20, 2015 in U.S. Appl. No. 13/965,746, filed Aug. 13, 2013, 9 pages.

Notice of Allowance mailed Jan. 21, 2016 in U.S. Appl. No. 14/827,056, filed Aug. 14, 2015, 15 pages.

* cited by examiner

MAGNETIC CONTACTS

RELATED APPLICATIONS

This application is a divisional application of U.S. patent application Ser. No. 14/827,056, entitled MAGNETIC CONTACTS, filed Aug. 14, 2015 which is a continuation application of U.S. patent application Ser. No. 13/965,746, entitled MAGNETIC CONTACTS, filed Aug. 13, 2013, now U.S. Pat. No. 9,142,475, and claims priority to the Ser. Nos. 14/827,056 and 13/965,746 applications. The Specifications of Ser. Nos. 14/827,056 and 13/965,746 are hereby fully incorporated by reference.

FIELD

Embodiments of the present disclosure generally relate to the field of integrated circuits, and more particularly, to techniques and configurations for integrated circuit (IC) package assemblies and various other devices with electric contacts.

BACKGROUND

Conventional IC package assemblies include components constructed from various materials with different coefficients of thermal expansion (CTE), including plastics, metals, and silicon. Where two components are connected by solder joints, a CTE mismatch between the two components can result in movement upon heating and cooling, which in turn produces a shear strain on the solder joints. Underfill is used in some IC package assemblies to reduce the CTE mismatch. Nonetheless, repeated thermal fluctuations can lead to fatigue fractures in the solder joints, underfill, and other components.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
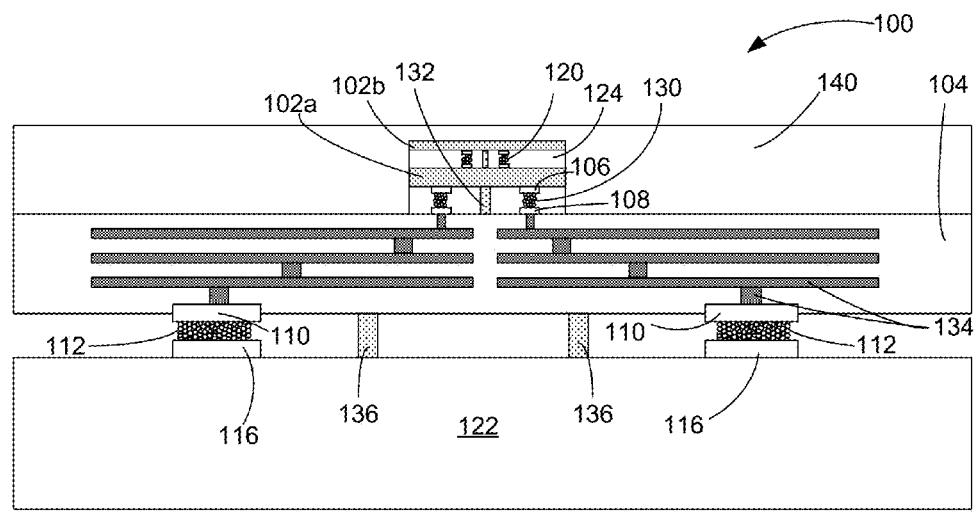
FIGS. 1A-1B illustrate a schematic cross-section side view of an example integrated circuit (IC) package assembly and portions thereof, in accordance with various embodiments.

Embodiments of the present disclosure describe techniques and configurations for IC substrates with magnetic contacts. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout unless otherwise indicated, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

As used herein, the "Curie temperature" of a magnet or magnetic article is the temperature at which the magnet or magnetic article loses essentially all magnetization. As used herein, the "maximum operating temperature" or "MOT" of a magnet or magnetic article is the highest temperature to which the magnet or magnetic article can be heated without becoming at least partially demagnetized. As used herein, the "partial demagnetization temperature" or "PDT" is a temperature or range of temperatures at which a magnet or magnetic article is partially demagnetized. In various embodiments, magnets/magnetic articles that are heated to their PDT may retain some of their magnetic strength (e.g., 99-50%, 75-25%, 60-40%, 50-20%, or 30-5% of original magnetic strength). In some embodiments, the reduction in magnetic strength of the magnet/magnetic article after heating to the PDT may be sufficient to cause the magnet/magnetic article to become uncoupled from an adjacent magnet/magnetic article when additional force (e.g., mechanical pulling/pushing, fluid pressure, or the like) is applied to the magnet/magnetic article. In other embodiments, the reduction in magnetic strength of the magnet/magnetic article after heating to the PDT may be sufficient to cause the magnet/magnetic article to become uncoupled from an adjacent magnet/magnetic article without the application of additional force to the magnet/magnetic article.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the phrase "through-substrate via" or "TSV" may be used in reference to an electrically conductive through-hole that extends at least partially through a die or other semiconductor substrate/device, such as an interposer. Through-substrate vias may include through-silicon vias as well as vias through other types of substrates. Thus, the phrase "through-substrate via" or "TSV" may be used for such electrically conductive features even when the semiconductor material is composed of a material other than silicon.

The phrases "integrated circuit substrate" and "IC substrate" are used interchangeably herein. An IC substrate can be any structure configured to route electrical signals, such as input/output (I/O) signals, ground signals, and/or power signals, to and from another IC substrate. Examples of IC substrates include, but are not limited to, dies, circuit boards (e.g., printed circuit boards), interposers, and package substrates (e.g., bumpless build-up layer (BBUL) substrates, coreless substrates, laminate substrates). Some IC substrates may include one or more electrically conductive features (e.g., traces, trenches, vias, bond pads, pillars), electrically insulating materials (e.g., dielectric film, plastic, resin), and/or semiconductor materials (e.g., silicon, germanium, gallium arsenide, silicon germanium). The term "component" may also be used in reference to an IC substrate that is part of an IC package assembly or portion thereof.

Embodiments described herein provide integrated circuit (IC) package assemblies with magnetic contacts/interconnect structures, components thereof, and corresponding fabrication techniques. However, such magnetic contacts and fabrication methods may also be used to form electrical connections in a variety of other applications, as will be readily understood by those skilled in the art. As such, the present disclosure is not intended to be limited to IC circuit assemblies/components, but is intended to encompass other systems, apparatuses, and methods in which magnetic contacts as described herein are used to form electrical connections.

In various embodiments, two or more IC substrates may be coupled by an interconnect structure that includes a plurality of electrically conductive magnetic particles (EC-MPs). In some embodiments, the IC substrates may have electrical routing features coupled with one or more magnets. The electrical routing features of one IC substrate may be spaced apart from corresponding electrical routing features of the other IC substrate by a gap. The magnets and/or the electrical routing features may generate magnetic fields that overlap in the gap.

The ECMPs may self-align in the magnetic field to form an interconnect structure, such as a conductive bridge, that extends across the gap from one electrical routing feature to another. In various embodiments, the ECMPs may self-align to form the interconnect structure at room temperature (e.g., 20° C. to 26° C., or 68° F. to 78° F.). In some embodiments, the ECMPs may be movably coupled together by the magnetic field, and the interconnect structures may be pliable and/or flexible. In other embodiments, the ECMPs may be fixedly coupled together, such as by a reflow/melting process. The magnetic electrical routing features and/or the ECMP's may be configured to have a predetermined MOT, PDT, and/or Curie temperature.

In some embodiments, one or more of the IC substrates may be a package substrate, an interposer, a circuit board, or another IC package component. In other embodiments, the IC substrates may be dies. For example, one IC substrate may be a die, such as a microprocessor/CPU with one or more TSVs, and the other IC substrate may be a second die (e.g., a memory die or a memory die stack). In some embodiments, conductive magnetic particles may form a plurality of interconnect structures between the IC substrates. In various embodiments, remaining space between the IC substrates may be filled with a fluid (e.g., a gas, a liquid, or a gel). In some embodiments, underfill material may be provided between the IC substrates. In other embodiments, a relatively flexible material such as a plastic/polymer, a foam, a gel, or other suitable material may be provided between the IC substrates.

While specific implementations/configurations of magnetic interconnect structures are described herein for illustrative purposes, these implementations and configurations are not intended to be exhaustive or to limit the embodiments of the present disclosure to the precise forms disclosed. For example, magnetic interconnect structures as described herein may be implemented in various testing systems and design/debug tools related to the testing, design, or production of IC package assemblies and components thereof, and in various electronic devices having integrated circuits, as well as in IC package assemblies/components. Other equivalent modifications are possible within the scope of the present disclosure, as those skilled in the relevant art will recognize.

Figure 1B:
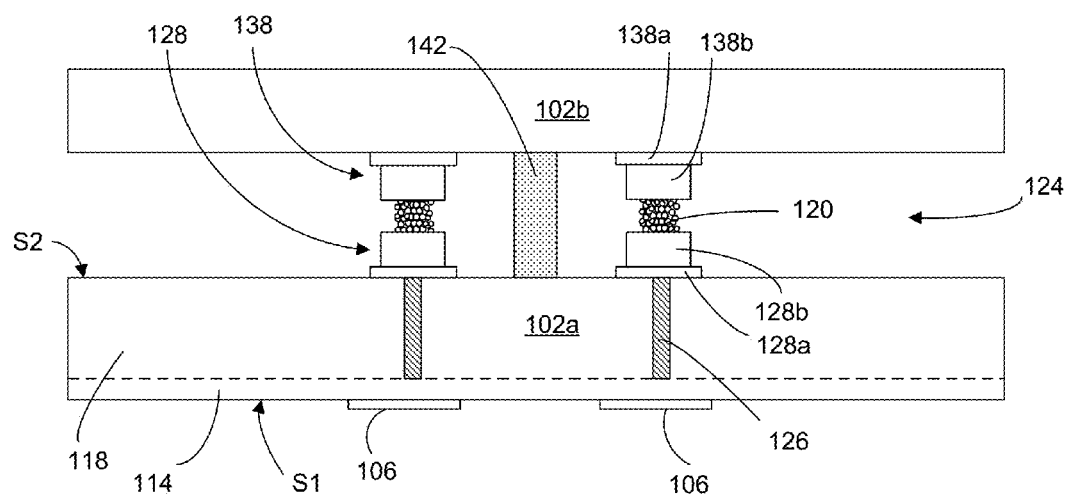

FIG. 1A depicts a schematic side cross-sectional view of an integrated circuit (IC) package assembly 100, in accordance with various embodiments. FIG. 1B depicts a schematic side cross-sectional view of a die portion of IC package assembly 100, in accordance with various embodiments.

Referring first to FIG. 1A, IC package assembly 100 may include a first die 102a, a second die 102b coupled with first die 102a, a package substrate 104 coupled with first die 102a and/or second die 102b, and a circuit board 122 coupled with package substrate 104. Some embodiments may lack one or more of these components. In other embodiments, IC package assembly 100 may include one or more additional components such as capacitors, additional dies, and/or other IC substrates.

In various embodiments, two or more components of IC package assembly 100 (e.g., IC substrates such as first die 102a, second die 102b, package substrate 104, circuit board 122) may be coupled together by corresponding interconnect structures. As described further herein, some or all of the interconnect structures may be magnetic interconnect structures having a plurality of electrically conductive magnetic particles (ECMPs). In some embodiments, the ECMPs may be movably coupled together by a magnetic field, and the magnetic interconnect structure may be pliable/flexible. In other embodiments, the ECMPs may be fixedly coupled together (e.g., by solderable material).

Embodiments may vary as to the number, arrangement, and type(s) of interconnect structures. While the interconnect structures illustrated in FIGS. 1A-1B are described below as magnetic interconnect structures, other embodiments may have some components that are coupled by magnetic interconnect structures and other components that are coupled by conventional interconnect structures (e.g., solder, solderable material). Still other embodiments may include two components coupled together by both magnetic interconnect structures and conventional interconnect structures in various combinations and arrangements.

Referring now to FIG. 1B, first die 102a may have a first side S1 and a second side S2 opposite to the first side S1. First side S1 may be the side of the die commonly referred to as the "active" or "top" or "front" side of the die. First side S1 may include one or more transistors. Second side S2 may be the side of the die commonly referred to as the "inactive" or "bottom" or "back" side of the die.

First side S1 may include an active layer 114 with one or more transistors formed thereon. The one or more transistors may be located below the outer surface of first side S1 and are routed to the outer surface of first side S1 by a series of metal and oxide layers. Second side S2 may include a semiconductor substrate 118 composed of a semiconductor material. The semiconductor substrate 118 may be composed of n-type or p-type material systems and may include, for example, a crystalline substrate formed using a bulk silicon or a silicon-on-insulator substructure.

In some embodiments, first die 102a may include one or more through-silicon vias (TSVs) 126 formed at least partially through semiconductor substrate 118. First side S1 of first die 102a may include electrical routing features 106. In some embodiments, electrical routing features 106 may be bond pads. Second side S2 may also include one or more electrical routing features 128. In some embodiments, electrical routing features 128 may be TSV pads coupled to corresponding TSVs 126. TSVs 126 may be configured to route electrical signals between the active layer 114 on first side S1 and the electrical routing features 128 on second side S2 of die 102a.

Some embodiments may include a second die 102b with one or more electrical routing features 138. In some embodiments, second die 102b may include a plurality of dies, additional electrical routing features, and/or TSVs. Other embodiments may lack a second die 102b.

Electrical routing features 106/128/138 may have one or more electrically conductive pads, bumps, pillars, and/or other such structures, alone or in any combination. For example, as illustrated in FIG. 1B, electrical routing features 138 may include conductive pillars 138b formed on conductive pads 138a, and electrical routing features 128 may include conductive pillars 128b formed on conductive pads 128a. In various embodiments, electrical routing features 106/128/138 may include one or more of nickel, palladium, platinum, tin, silver, gold, copper, or other metals, alone or in any combination. For example, in some embodiments, conductive pillars 128b/138b may be copper pillars.

Electrical routing features 138 of second die 102b may be coupled with the electrical routing features 128 of first die 102a by interconnect structures 120. In various embodiments, interconnect structures 120 may be magnetic interconnect structures having a plurality of conductive magnetic particles, as further described with reference to FIGS. 2A-B and 3A-H. In other embodiments, one or more of the interconnect structures 120 may be formed with solderable material (e.g., solder paste, solder balls). In various embodiments, interconnect structures 120 may have magnetic particles and solderable material around/within the magnetic particles.

In various embodiments, first die 102a and second die 102b may be singulated dies. In some embodiments, first die 102a and/or second die 102b may be a wafer (or portion thereof) having two or more dies formed thereon. In other embodiments, first die 102a and/or second die 102b may include two or more dies arranged in a stack. In various embodiments, first die 102a and/or second die 102b may be a primary logic die. In other embodiments, first die 102a and/or second die 102b may be configured to function as memory, an application specific circuit (ASIC), a processor, or some combination thereof. In some embodiments, first die 102a may be a CPU/processor and second die 102b may be one or more memory dies. Some embodiments may lack a second die 102b. In other embodiments, one or more additional dies may be coupled with first die 102a, second die 102b, and/or package substrate 104.

In some embodiments, second die 102b may be coupled to first die 102a in a front-to-back configuration (e.g., the "front" or "active" side of second die 102b coupled to the "back" or "inactive" side S1 of first die 102a), as shown for example in FIG. 1B. In other configurations, first and second dies 102a/102b may be coupled with one another in a front-to-front, back-to-back, or side-to-side arrangement. In other embodiments, second die 102b may be arranged at an angle to first die 102a, such as an angle in the range of 45-135 degrees, 60-120 degrees, or approximately 90 degrees.

In various embodiments, one or more spacers 142 may be provided between first die 102a and second die 102b. Spacer 142 may be a pillar or other structure configured to maintain a minimum distance between first and second dies 102a and 102b. In some embodiments, spacer 142 may be fixedly coupled with one or both of first and second dies 102a/102b. The position of spacer 142 may vary among embodiments. In some embodiments, spacer 142 may be provided at or near the center of the outer surface of one or both dies 102a/102b. In other embodiments, one or more spacers 142 may be provided in other locations, such as an edge, a corner, or other area. Some embodiments may lack a spacer 142. In various embodiments, spacer(s) 142 may be made of any one or more suitable materials, including but not limited to metals, ceramics, plastics/polymers, resins, and the like. In some embodiments, spacer(s) 142 may be integral to one or both of first and second dies 102a/102b.

In some embodiments, a space 124 between first die 102a and second die 102b may be filled with a fluid, such as a liquid, gas, or gel. For example, space 124 may be filled with helium or an inert gas. In other embodiments, space 124 may be fully or partially filled with a material such as an underfill material, an adhesive, or a dielectric/electrically insulating material. In some embodiments, space 124 may be partially or fully filled with a flexible material such as a plastic or polymer. In various embodiments, one or more materials or substances may be provided within space 124 to increase mechanical strength, heat dissipation, and/or adhesion.

In various embodiments, one or more of first die 102a and second die 102b may be embedded in an encapsulant 140. Encapsulant 140 can be any suitable material, such as (but not limited to) an Ajinomoto Build-up Film (ABF) substrate or other build-up film, other dielectric/organic materials, resins, epoxies, polymer adhesives, silicones, acrylics, polyimides, cyanate esters, thermoplastics, and/or thermosets. In other embodiments, IC package assembly 100 may lack encapsulant 140.

Referring again to FIG. 1A, in some embodiments, first die 102a may be coupled to package substrate 104 by interconnect structures 130. For example, as illustrated in FIG. 1A, package substrate 104 may have a first side with one or more electrical routing features 108 such as conductive pads or pillars, and electrical routing features 108 may be coupled with electrical routing features 106 by interconnect structures 130. A second opposite side of package substrate 104 may have one or more electrical routing features 110. Interconnect structures 112 may couple electrical routing features 110 to corresponding electrical routing features 116 on circuit board 122. In various embodiments, electrical routing features 110 may be arranged in a ball grid array (BGA) or other configuration. In some embodiments, one or more spacers 132 may be provided between first die 102a and package substrate 104.

In various embodiments, one or more of interconnect structures 112/120/130 may be magnetic interconnect structures having a plurality of conductive magnetic particles, as further described with reference to FIGS. 2A-B and 3A-H. In some embodiments, one or more of interconnect structures 112/120/130 may include magnetic particles and solderable material around/within the magnetic particles. In other embodiments, one or more of the interconnect structures 112/120/130 may be a conventional interconnect structure (e.g., bump, pillar, ball) formed with any of a wide variety of materials including, for example, metals, alloys, solderable material, or combinations thereof. Other embodiments may lack one or more of interconnect structures 112/120/130. For example, in some embodiments, first die 102a may be embedded in package substrate 104, and IC package assembly 100 may lack interconnect structures 130. Spacing/pitch of features such as electrical routing features 106/128/138 and die interconnects 112/120/130 may vary among embodiments. In some embodiments, the distance between adjacent electrical routing features 106/128/138 may be in the range of 30-80 µm, 40-100 µm, less than 40 µm, or more than 100 µm.

Package substrate 104 may have conductive features 134, such as traces, trenches, and/or vias, formed therein to route electrical signals between the first/second die 102a/102b and circuit board 122 and/or other electrical components external to the IC package assembly 100.

In some embodiments, package substrate 104 may be a coreless substrate. For example, in various embodiments package substrate 104 may be a bumpless build-up layer (BBUL) assembly that includes a plurality of "bumpless" build-up layers. As used herein, "bumpless build-up layers" may refer to layers of substrate and components embedded therein without the use of solder or other attaching means that may be considered "bumps." In various embodiments, one or more build-up layers described herein may have material properties that may be altered and/or optimized for reliability, warpage reduction, and so forth. In other embodiments, package substrate 104 may be an epoxy-based laminate substrate having a core and/or build-up layers such as, for example, an Ajinomoto Build-up Film (ABF) substrate. In other embodiments, package substrate 104 may include other suitable materials such as one or more polymers, ceramic, glass, or semiconductor materials. In some embodiments, package substrate 104 may be an interposer.

In various embodiments, circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. In other embodiments, the circuit board 122 may be composed of other suitable materials.

Some portions/features of circuit board 122 may not be depicted in FIG. 1A. In various embodiments, the circuit board 122 may include other electrical devices coupled to the circuit board that are configured to route electrical signals to or from first/second die 102a/102b through the circuit board 122. In some embodiments, circuit board 122 may include structures such as traces, trenches, and/or vias formed therein to route electrical signals through the circuit board 122. In some embodiments, the circuit board 122 may be a motherboard (e.g., motherboard 722 of FIG. 7). In some embodiments, one or more spacers 136 may be provided between package substrate 104 and circuit board 122. In various embodiments, spacers 132/136 may implemented/configured in the same or similar manner as described for spacer(s) 142.

Figure 2A:
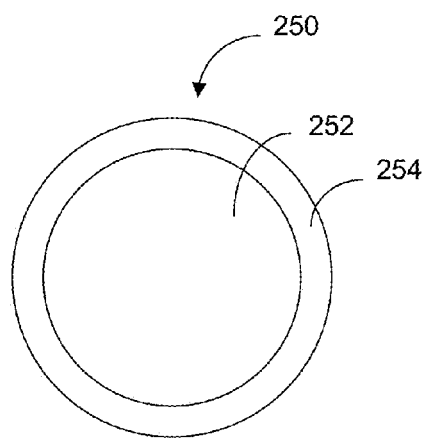
FIGS. 2A-2C illustrate schematic views of conductive magnetic particles, in accordance with some embodiments.
Figure 2B:
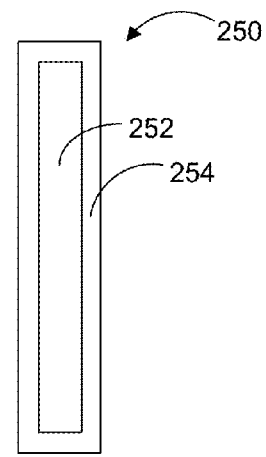
Figure 2C:
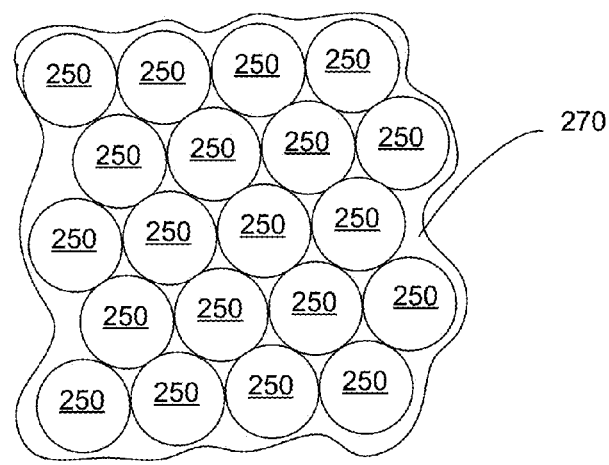

FIGS. 2A-2C illustrate schematic views of conductive magnetic particles, in accordance with some embodiments. FIG. 2A illustrates a schematic side cross-section view of a magnetic particle 250 with a magnetic core 252 and an electrically conductive coating 254. Magnetic core 252 may include any one or more suitable ferromagnetic/ferromagnetic materials, including but not limited to iron, nickel, cobalt, rare-earth metals, lodestone, ferrites, ferrofluids, and alloys/composites that include one or more ferromagnetic/ferromagnetic materials (e.g., samarium-cobalt). In some embodiments, magnetic core 252 may be a neodymium magnet. In some embodiments, magnetic core 252 may include any one or more of the materials shown below in Table 1.

TABLE 1

| Material | Curie Temperature (K) | Curie Temperature (C) |
|---|---|---|
| Iron (Fe) | 1043 | 769.85 |
| Cobalt (Co) | 1400 | 1126.85 |
| Nickel (Ni) | 631 | 357.85 |
| Gadolinium (Gd) | 292 | 18.85 |
| Dysprosium (Dy) | 88 | −185.15 |
| MnBi | 630 | 356.85 |
| MnSb | 587 | 313.85 |
| $CrO_2$ | 386 | 112.85 |
| MnAs | 318 | 44.85 |
| EuO | 69 | −204.15 |
| Iron(III) oxide ($Fe_2O_3$) | 948 | 674.85 |
| Iron(II,III) oxide (FeOFe2O3) | 858 | 584.85 |
| NiOFe2O3 | 858 | 584.85 |
| CuOFe2O3 | 728 | 454.85 |
| MgOFe2O3 | 713 | 439.85 |
| MnOFe2O3 | 573 | 299.85 |
| Y3Fe5O12 | 560 | 286.85 |

Electrically conductive coating 254 may include one or more conductive metals, alone or in any suitable combination (e.g., metal alloys. In some embodiments, electrically conductive coating 254 may include a metal that is substantially resistant to oxidation (e.g., palladium, platinum, gold).

In other embodiments, electrically conductive coating 254 may include a metal that forms conductive oxides upon oxidization (e.g., silver). In some embodiments, electrically conductive coating 254 may have two or more layers.

Other embodiments may lack electrically conductive coating 254. For example, in various embodiments, the magnetic core 252 may be electrically conductive. In other embodiments, magnetic particles 250 that lack an electrically conductive coating 252 and are not electrically conductive may be provided as a suspension in a medium 170 (e.g., a viscous liquid or gel) that is electrically conductive and allows the magnetic particles 250 to move/self-align when placed in a magnetic field (see e.g., FIG. 2C). Alternatively, magnetic particles 250 with an electrically conductive coating 252 or electrically conductive magnetic core 252 may be provided as a suspension in a medium 170 that is either electrically conductive or electrically non-conductive. In other embodiments, magnetic particles 250 may be provided in the form of a dust, a powder, or the like.

The shape, size, and other characteristics of the magnetic particles may vary among embodiments. While FIG. 1A shows a generally spherical/spheroid magnetic particle 250, other magnetic particles 250 may have other shapes. Examples include, but are not limited to, oblong, cylindrical/rod/disk-shaped, rectangular, pyramidal, cubic, cuboidal, conical, and irregularly-shaped magnetic particles 250. In some embodiments, as illustrated in FIG. 2B, magnetic particles 250 may have an elongated shape. Some magnetic particles may be relatively flat, which may provide improved contact with outer surfaces of electrical routing features. The size(s) of magnetic particles 250 may vary among embodiments, as further described below with reference to FIGS. 3A-3H.

Figure 3A:
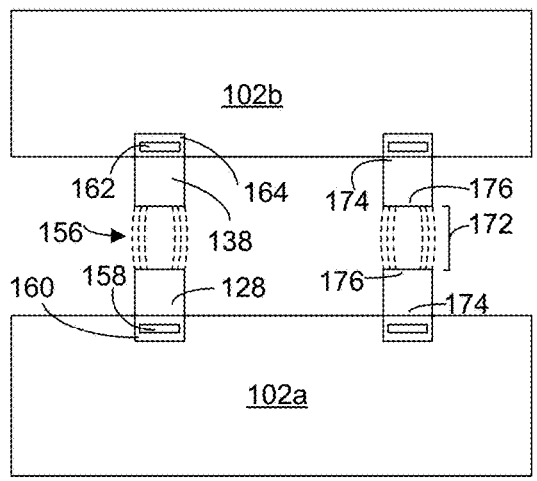
FIGS. 3A-3H illustrate schematic cross-section side views of IC substrates with magnetic interconnect structures, in accordance with some embodiments.

FIGS. 3A-3H illustrate schematic cross-section side views of IC substrates with magnetic interconnect structures, in accordance with some embodiments. As shown in FIGS. 3A-3H, first die 102a may have one or more electrical routing features 128 coupled with one or more magnets 158. Second die 102b may have one or more electrical routing features 138 coupled with one or more magnets 162. Each of the electrical routing features 128/138 may have a base portion 174 and a top portion 176 (FIG. 3A). In some embodiments, electrical routing features 128/138 may be pillars, conductive pads, or some combination thereof, and may have any suitable size and shape.

Magnets 158/162 may include any suitable ferromagnetic/ferrimagnetic material, including but not limited to iron, nickel, cobalt, rare-earth metals, lodestone, ferrites, ferrofluids, and alloys/composites that include one or more ferromagnetic/ferrimagnetic materials (e.g., samarium-cobalt). In some embodiments, magnets 158/162 may be neodymium magnets. In some embodiments, magnets 158/162 may include any one or more of the materials shown below in Table 2.

TABLE 2

| Material | Curie Temperature (K) | Curie Temperature (C) |
|---|---|---|
| Iron (Fe) | 1043 | 769.85 |
| Cobalt (Co) | 1400 | 1126.85 |
| Nickel (Ni) | 631 | 357.85 |
| Gadolinium (Gd) | 292 | 18.85 |
| Dysprosium (Dy) | 88 | −185.15 |
| MnBi | 630 | 356.85 |
| MnSb | 587 | 313.85 |
| CrO2 | 386 | 112.85 |

TABLE 2-continued

| Material | Curie Temperature (K) | Curie Temperature (C) |
|---|---|---|
| MnAs | 318 | 44.85 |
| EuO | 69 | −204.15 |
| Iron(III) oxide (Fe$_2$O$_3$) | 948 | 674.85 |
| Iron(II,III) oxide (FeOFe2O3) | 858 | 584.85 |
| NiOFe$_2$O$_3$ | 858 | 584.85 |
| CuOFe2O3 | 728 | 454.85 |
| MgOFe$_2$O$_3$ | 713 | 439.85 |
| MnOFe$_2$O$_3$ | 573 | 299.85 |
| Y3Fe5O12 | 560 | 286.85 |

Magnets 158/162 may have opposing first and second poles (e.g., north and south). In some embodiments, magnets 158 and 162 may be arranged in opposite orientations relative to the corresponding electrical routing feature 128/138. For example, magnets 158 may be oriented with first poles extending toward the top portion 176 of corresponding electrical routing features 128, and magnets 162 may be oriented with second poles extending toward the top portion 176 of corresponding electrical routing features 138. Alternatively, magnets 158 may be oriented with second poles extending toward the top portion 176 of corresponding electrical routing features 128, and magnets 162 may be oriented with first poles extending toward the top portion 176 of corresponding electrical routing features 138. In some embodiments, some of the magnets 158 may be oriented with first poles extending toward the top portion 176, other magnets 158 may be oriented with second poles extending toward the top portion 176, and each magnet 162 may have an orientation opposite to that of the corresponding magnet 158.

The first and second dies 102a and 102b may be positioned such that an electrical routing feature 128 of first die 102a and a corresponding electrical routing feature 138 of second die 102b are axially aligned and spaced apart by a gap 172 (FIG. 3A). Corresponding magnets 158 and 162 may collectively generate a magnetic field 156 that extends across the gap 172 (FIGS. 3A, 3C, 3E, 3F). In some embodiments, when electrical routing features 128 and 138 are positioned in substantial axial alignment and substantial proximity, magnetic fields generated by each of magnets 158 and 162 may meet or overlap to form magnetic field 156. These magnetic fields may be complimentary and/or additive due to the opposite orientations of corresponding magnets 158 and 162 (e.g., north-to-south, north-to-south).

Figure 3B:
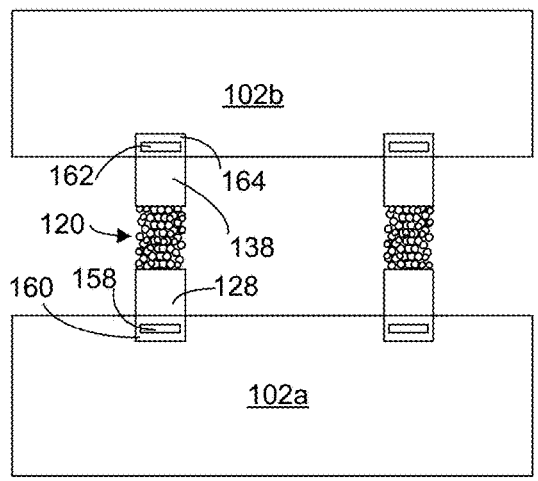

In some embodiments, one or more of the magnets may be embedded in the IC substrate(s). For example, magnets 158/162 may be embedded in dies 102a/102b (FIGS. 3A-B). In some embodiments, magnets 158/162 may be coupled with an electrically conductive material 164, such as a layer or coating of a metal. Electrically conductive material 164 may in turn be conductively coupled with the corresponding electrical routing feature 128/138.

Figure 3C:
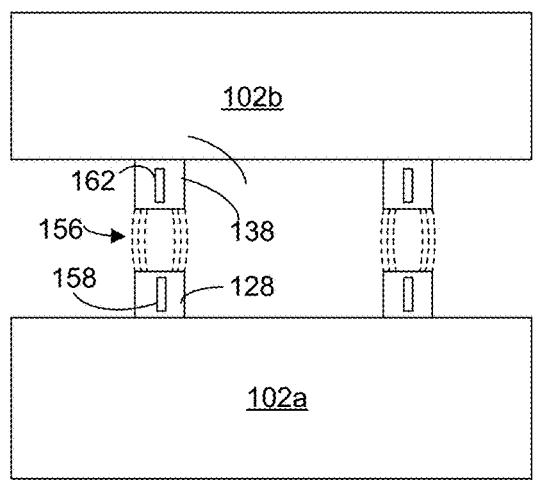
Figure 3D:
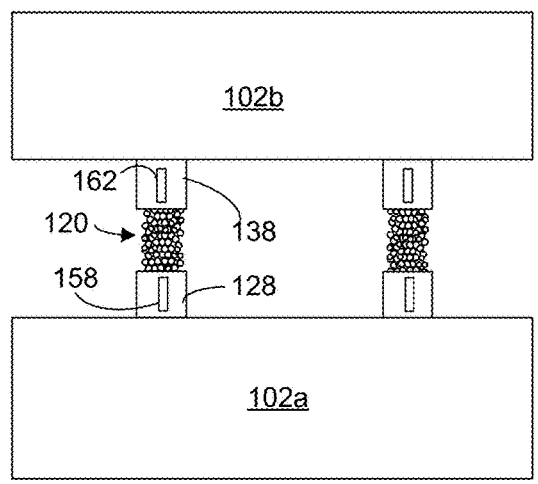

In other embodiments, one or more of the magnets may be embedded in the electrical routing features. For example, in some embodiments, magnets 158/162 may be disposed within corresponding electrical routing features 128/138 and may extend lengthwise/axially from base portion 174 to top portion 176 (FIGS. 3C-D). In other embodiments, magnets 158/162 may be disposed within the top portions 174 of electrical routing features 128/138 (FIG. 3E-F) or the base portions 176. In various embodiments, embedding the magnets within the electrical routing features (e.g., into pillars)

may provide a stronger and/or more localized magnetic field within the gap between the electrical routing features. In some embodiments, positioning the magnets proximal to the gap, such as on or near the top portions of the electrical routing features, may enhance the magnetic field within the gap.

Figure 3E:
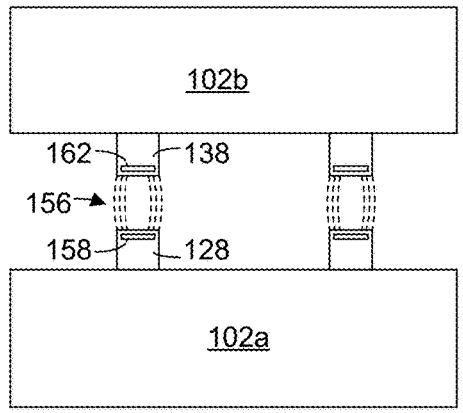
Figure 3F:
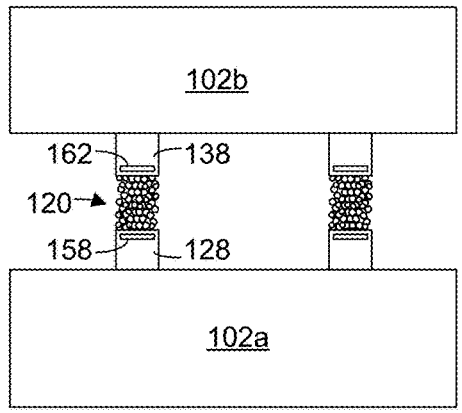
Figure 3G:
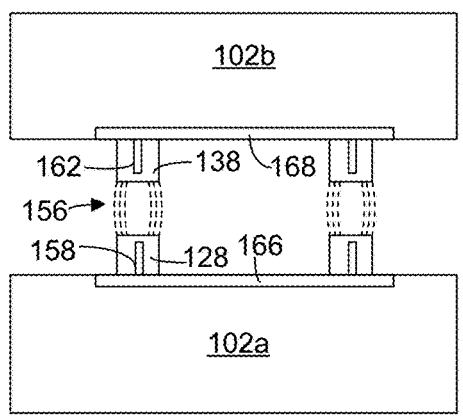
Figure 3H:
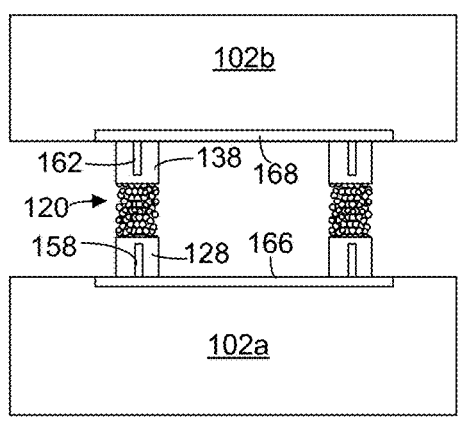

In some embodiments, one or more IC substrates may include a magnetic bus, in which two magnets are coupled with a third magnet. For example, as illustrated in FIGS. 3E-F, first die 102a may have electrical routing features 128 with corresponding magnets 158. A third magnet 166 may be coupled with two or more of the magnets 158. In some embodiments, the third magnet 166 may be embedded in the IC substrate (e.g., embedded in first die 102a). In other embodiments, the third magnet 166 may be coupled to an outer surface of the IC substrate (e.g., coupled to an outer surface of first die 102a). Similarly, the second IC substrate (e.g., second die 102b) may have a third magnet 168 coupled with two or more of the magnets 162.

In various embodiments, magnets 158/162 may be arranged in different orientations to form a pole orientation pattern. FIGS. 8A-8D illustrate embodiments of IC assembly components with various pole orientation patterns. While magnets 158/162 are shown embedded within corresponding electrical routing features 128/138, in other embodiments some or all of the magnets 158/162 may be embedded in an IC substrate (e.g., first die 102a or second die 102b). The pole orientation of each magnet 158/162 is indicated in FIGS. 8A-8D by "+" and/or "−" symbols on the corresponding electrical routing feature 128/138.

Figure 8A:
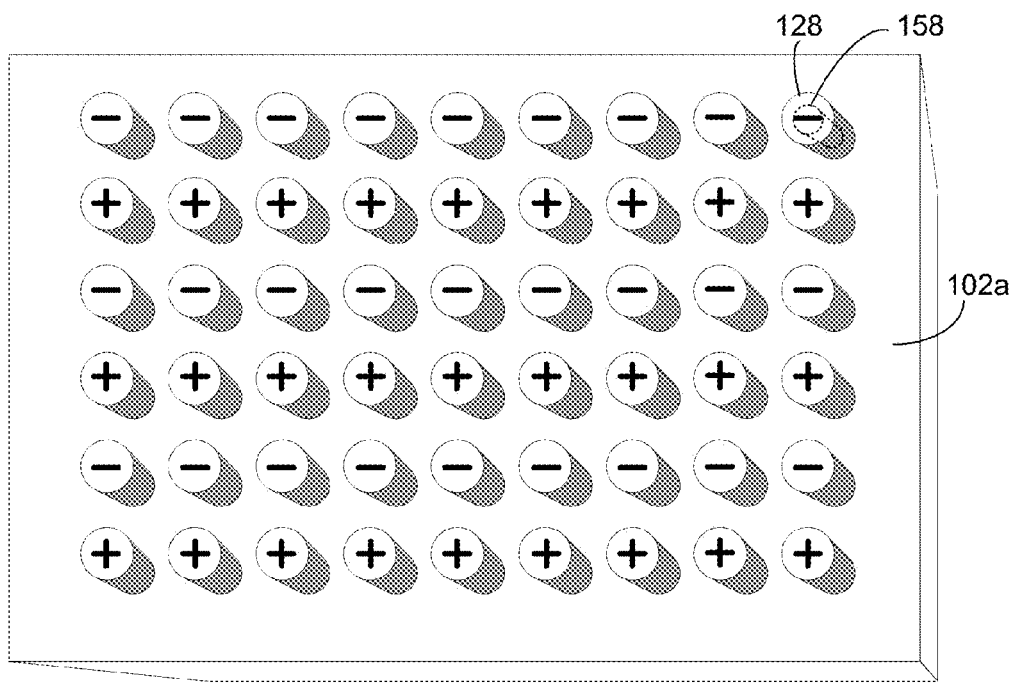
FIGS. 8A-8D illustrate schematic views of pole orientation patterns in accordance with various embodiments.
Figure 8B:
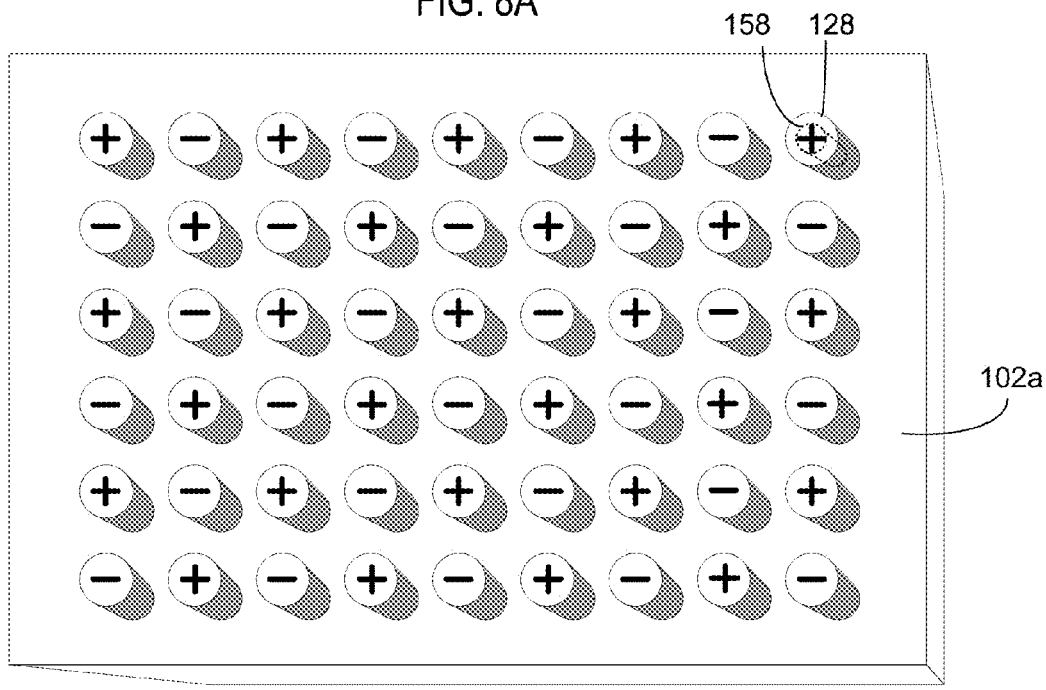

As shown in FIG. 8A, in some embodiments magnets 158 may be oriented to form an "alternating row" pole orientation pattern in which the magnets 158 of one row of electrical routing features 128 have a first orientation (e.g., north-south, or "+") and the magnets 158 of one or more adjacent rows have a second pole orientation (e.g., south-north, or "−"). In other embodiments, magnets 158 may be oriented to form a "checkerboard" pole orientation pattern in which magnets 158 of adjacent electrical routing features 128 have different/opposite pole orientations (FIG. 8B). In any case, electrical routing features 128 may be arranged in rows, concentric circles/rectangles, or any other suitable configuration. Therefore, embodiments may vary as to the arrangement of electrical routing features 128/138, pole orientation pattern of magnets 158/162, and combinations thereof.

Figure 8C:
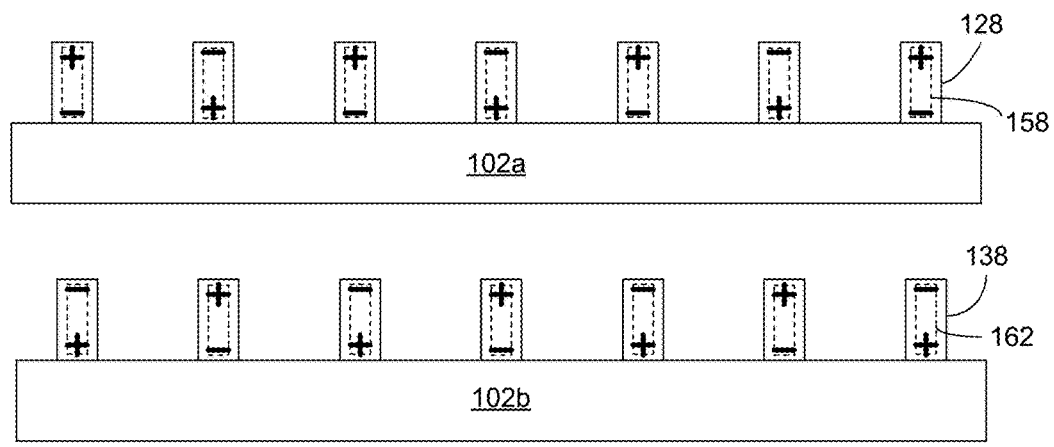
Figure 8D:
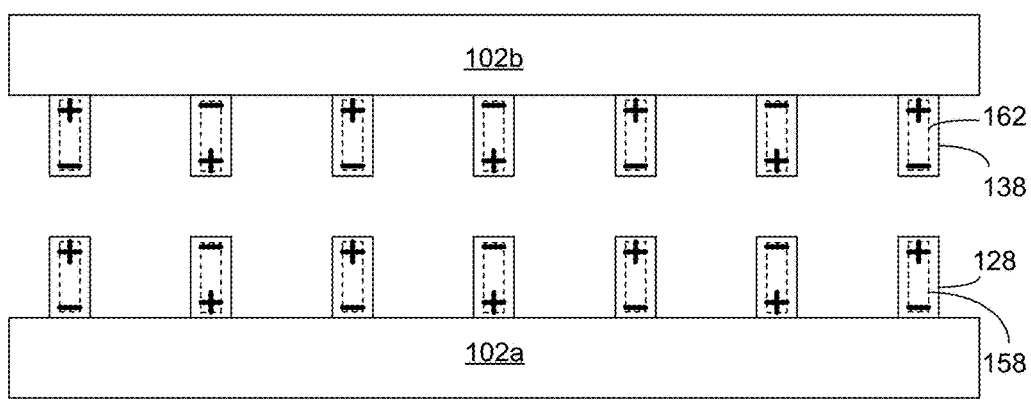

In some embodiments, magnets 162 of a second component (e.g., second die 102b) may be oriented to form a pole orientation pattern that is complementary to the pole orientation pattern of the first component (e.g., first die 102a; FIG. 8C). In some embodiments, a complementary pole orientation pattern may be a mirror image of the other pole orientation pattern, with corresponding magnets 158 and 162 having opposite pole orientations. As a result, when the first and second components (e.g., first and second dies 102a, 102b) are positioned to be coupled together, corresponding magnetic contacts 158 and 162 may have the same or similar pole alignment (e.g., "+" to "−" and "+" to "−", or "−" to "+" and "−" to "+"; FIG. 8D). In various embodiments, orienting magnets 158/162 to form complementary pole orientation patterns may help to facilitate alignment of components (e.g., first die 102a and second die 102b), increase speed of alignment/fabrication, and/or reduce misalignment.

While the IC substrates of FIGS. 3A-3H and 8A-8D are shown as dies, magnets 158/162/166/168 may be implemented in the same or similar manner with other IC substrates such as package substrates (e.g., package substrate 104), circuit boards (e.g., circuit board 122), and other types of IC substrates. For example, magnets 158/162/166/168 may be embedded any one or more of those IC substrates and/or their electrical routing features (e.g., electrical routing features 108, 110, 116).

Magnetic particles may self-align in the magnetic field to bridge the gap between corresponding electrical routing features, thereby forming a magnetic interconnect structure. As shown for example in FIGS. 3B, 3D, 3F, and 3H, interconnect structures 120 may be formed in the magnetic field 156 by a plurality of magnetic particles (e.g., 250; FIGS. 2A-C), which may be electrically conductive.

In some embodiments, the magnetic particles may have an average diameter in the range of 0.1% to 10% of the height of the gap between corresponding electrical routing features. For example, magnetic particles 250 may have average diameters in the range of 0.1% to 10% of the height of gap 172. In some embodiments, the gap (e.g., gap 172) may have a height in the range of 10-50 μm. In other embodiments, magnetic particles 250 may have average diameters in the range of 10 nm to 5 μm, 1 μm to 50 μm, 100 nm to 1 μm, 50 nm to 500 nm, or 100 nm to 300 nm. In various embodiments, the magnetic particles may be movably coupled together by the magnetic fields, resulting in magnetic interconnect structures that are pliable/flexible and resistant to fatigue failures during repeated cycles of heating and cooling. In some embodiments, one or more spacers may be provided between IC substrates that are coupled with magnetic interconnect structures. These spacers may be configured to maintain a predetermined distance between the IC substrates while allowing expansion/contraction of the IC substrates. In some embodiments, the spacer(s) may be fixedly coupled with the IC substrates, and the IC substrates may expand and contract outwardly from the spacer.

Figure 4A:
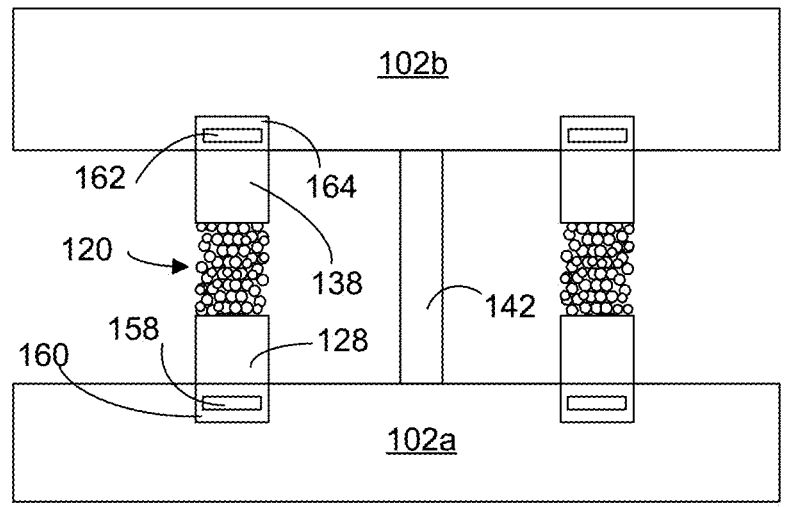
FIGS. 4A-4B illustrate a schematic cross-section side view of IC substrates with magnetic interconnect structures, in accordance with some embodiments.
Figure 4B:
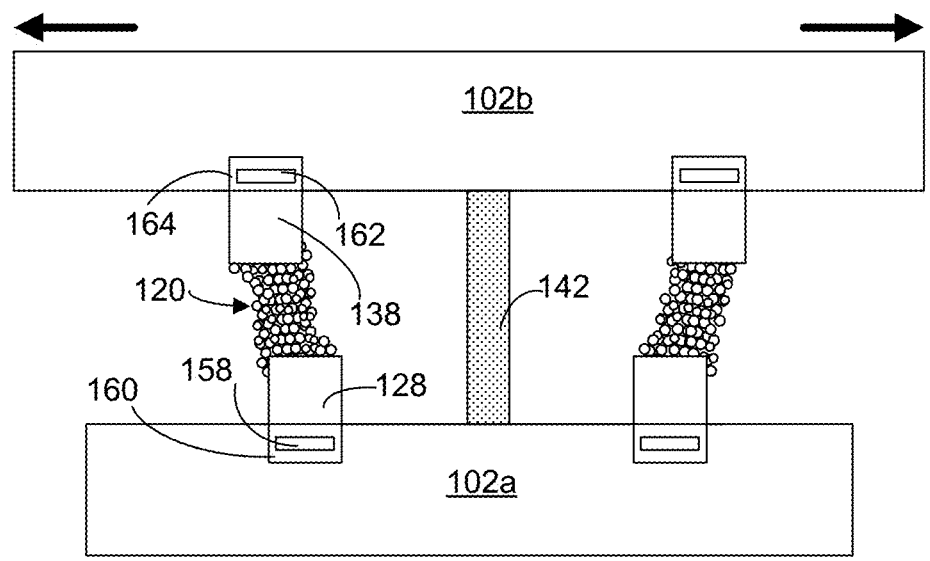

FIGS. 4A-4B illustrate a schematic cross-section side view of IC substrates coupled with magnetic interconnects and a spacer, in accordance with various embodiments. In the illustrated embodiment, first and second dies 102a and 102b are coupled with interconnect structures 120, which are formed by a plurality of magnetic particles that are movably coupled together by a magnetic field generated by magnets 162 and 158. In some embodiments, a spacer 142 may be fixedly coupled with first and/or second dies 102a and 102b. In various embodiments, a spacer (e.g., spacer 142) may be coupled with one or more IC substrates (e.g., dies, circuit boards, package substrates) using any suitable material or technique, including but not limited to adhesives, heating/pressure, and/or soldering.

As second die 102b expands outwardly from spacer 142 in response to heating, the positions of electrical routing features 138 may be shifted with respect to electrical routing features 128 (FIG. 4B). Because the magnetic particles are movably coupled and retained between the electrical routing features 128/138 by magnetic forces, the magnetic particles may move relative to one another while maintaining a connection between the corresponding electrical routing features. In addition, the stress/strain induced by the outward expansion may be at least partially relieved by the movement of the magnetic particles, allowing the interconnect structure to flex/deform over numerous thermal cycles with less fatigue than rigid interconnect structures (e.g., solder).

In various embodiments, spacer 142 may be configured to dissipate heat. In some embodiments, spacer 142 may be coupled with a heat sink (not shown), and may be configured to conduct heat away from dies 102a/102b. In other embodiments, spacer 142 may be used as a conductive connection.

For example, spacer 142 may be formed with one or more metals or other electrically conductive materials. Alternatively, one or more magnets (not shown) may be positioned within or proximal to spacer 142 to generate a magnetic field around spacer 142, and a plurality of magnetic particles may form a magnetic interconnect structure on or around spacer 142 within the magnetic field.

In other embodiments, magnetic interconnect structures as described herein may be implemented in various testing systems, design/debug tools, and other devices related to the testing, design, or production of IC package assemblies and components thereof. In some embodiments, magnetic interconnect structures as described herein may be implemented for use as thermal fuses. For example, the magnets (e.g., magnets 162/158) may be designed to have a predetermined MOT, PDT, and/or Curie temperature. Similarly, in various embodiments the magnetic particles 250 may be designed to have a predetermined MOT/PDT/Curie temperature. In some embodiments the magnets may have a higher PDT temperature than the magnetic particles. In other embodiments, the magnetic particles may have a higher MOT/PDT/Curie temperature than the magnets. In still other embodiments, one of the magnets may have a higher MOT/PDT/Curie temperature than the other magnet.

In any case, the magnetic particles may be used to form magnetic interconnect structures (e.g., 112/120/130) between two IC substrates (e.g., dies 102a and 102b, die 102a and package substrate 104, package substrate 104 and circuit board 122, etc.). Heating one or more of the magnets and/or the magnetic particles to the corresponding PDT/Curie temperature may result in a loss of magnetism and disconnection of the magnetic interconnect structure from one or both of the electrical routing features. In some embodiments, the magnetic particles of the magnetic interconnect structure may lose sufficient magnetism to detach from the electrical routing features and/or one another. In other embodiments, one of the magnets may lose magnetism and the magnetic particles may become uncoupled from the corresponding electrical routing feature. In that case, some or all of the magnetic particles may remain coupled with the electrical routing feature of the other IC substrate, or with another electrical routing feature and/or magnetic interconnect structure.

In some embodiments, the PDT and/or Curie temperature of one or more of the first magnet, the second magnet, and the conductive magnetic particles may be below a solder reflow temperature. For example, in some embodiments, the PDT of one or more of the first magnet, the second magnet, and the conductive magnetic particles may be in the range of 100-250° C., 110-240° C., 120-230° C., 100-120° C., 110-130° C., 120-140° C., 130-150° C., 140-160° C., 150-170° C., 160-180° C., 170-190° C., 180-200° C., 190-210° C., 200-220° C., 210-230° C., 220-240° C., 230-250° C., 240-260° C., 250-270° C., 260-280° C., 270-290° C., 280-300° C., 290-310° C., 300-320° C., 310-330° C., 320-340° C., 330-350° C., 340-360° C., 350-370° C., 360-380° C., 370-390° C., 380-400° C., 390-410° C., 400-420° C., 410-440° C., 420-440° C., 430-450° C., 440-460° C., or 440-460° C. In other embodiments, the Curie temperature of one or more of the first magnet, the second magnet, and the conductive magnetic particles may be in the range of 100-250° C., 110-240° C., 120-230° C., 100-120° C., 110-130° C., 120-140° C., 130-150° C., 140-160° C., 150-170° C., 160-180° C., 170-190° C., 180-200° C., 190-210° C., 200-220° C., 210-230° C., 220-240° C., 230-250° C., 240-260° C., 250-270° C., 260-280° C., 270-290° C., 280-300° C., 290-310° C., 300-320° C., 310-330° C., 320-340° C., 330-350° C., 340-360° C., 350-370° C., 360-380° C., 370-390° C., 380-400° C., 390-410° C., 400-420° C., 410-440° C., 420-440° C., 430-450° C., 440-460° C., or 440-460° C. In some embodiments, one or more of the first magnet, the second magnet, and the conductive magnetic particles may include any one or more of the materials shown below in Table 3.

TABLE 3

| Material | Curie Temperature (K) | Curie Temperature (C) |
| --- | --- | --- |
| Iron (Fe) | 1043 | 769.85 |
| Cobalt (Co) | 1400 | 1126.85 |
| Nickel (Ni) | 631 | 357.85 |
| Gadolinium (Gd) | 292 | 18.85 |
| Dysprosium (Dy) | 88 | −185.15 |
| MnBi | 630 | 356.85 |
| MnSb | 587 | 313.85 |
| CrO2 | 386 | 112.85 |
| MnAs | 318 | 44.85 |
| EuO | 69 | −204.15 |
| Iron(III) oxide (Fe$_2$O$_3$) | 948 | 674.85 |
| Iron(II,III) oxide (FeOFe2O3) | 858 | 584.85 |
| NiOFe$_2$O$_3$ | 858 | 584.85 |
| CuOFe2O3 | 728 | 454.85 |
| MgOFe$_2$O$_3$ | 713 | 439.85 |
| MnOFe$_2$O$_3$ | 573 | 299.85 |
| Y3Fe5O12 | 560 | 286.85 |

Thus, in some embodiments an IC substrate, component, or device may include a plurality of magnets, each coupled with a different electrical routing feature. The IC substrate may be coupled with another IC substrate, component, or device by forming magnetic interconnect structures with magnetic particles as described herein. One of the IC substrates may be configured to monitor the connectivity status of the magnetic interconnect structures, and/or to determine whether a given pair of electrical routing features remains conductively coupled by the corresponding magnetic interconnect structure. In some embodiments, the plurality of magnets may include magnets with different PDT/Curie temperatures, and the temperature of one or both IC substrates may be monitored or assessed by determining which (if any) of the electrical routing features has become conductively uncoupled from the other IC substrate/component/device. In other embodiments, magnets with the same or similar PDT/Curie temperature may be disposed in different locations along the IC substrate, and the local temperatures of corresponding portions of the IC substrate may be monitored or assessed by determining which (if any) of the electrical routing features has become conductively uncoupled from the other IC substrate/component/device.

In some implementations, the magnets/magnetic particles may be configured to disconnect the IC substrate (e.g., second die 102b) from the other IC substrate/component/device (e.g., first die 102a) at a predetermined temperature to prevent overheating or heat-induced damage. In another implementation, the IC substrates/components/devices may be coupled with a plurality of magnetic interconnect structures and incorporated in a temperature monitoring device designed to be placed/worn on the skin of a human or animal. The temperature monitoring device may be configured to determine the status of the magnetic interconnect structures (e.g., conductively coupled or conductively uncoupled), and to correlate the status with a temperature. For example, the device may equate a loss of particular connection(s) or a loss of a predetermined number of connection(s) to a particular temperature or range of temperatures.

Figure 5:
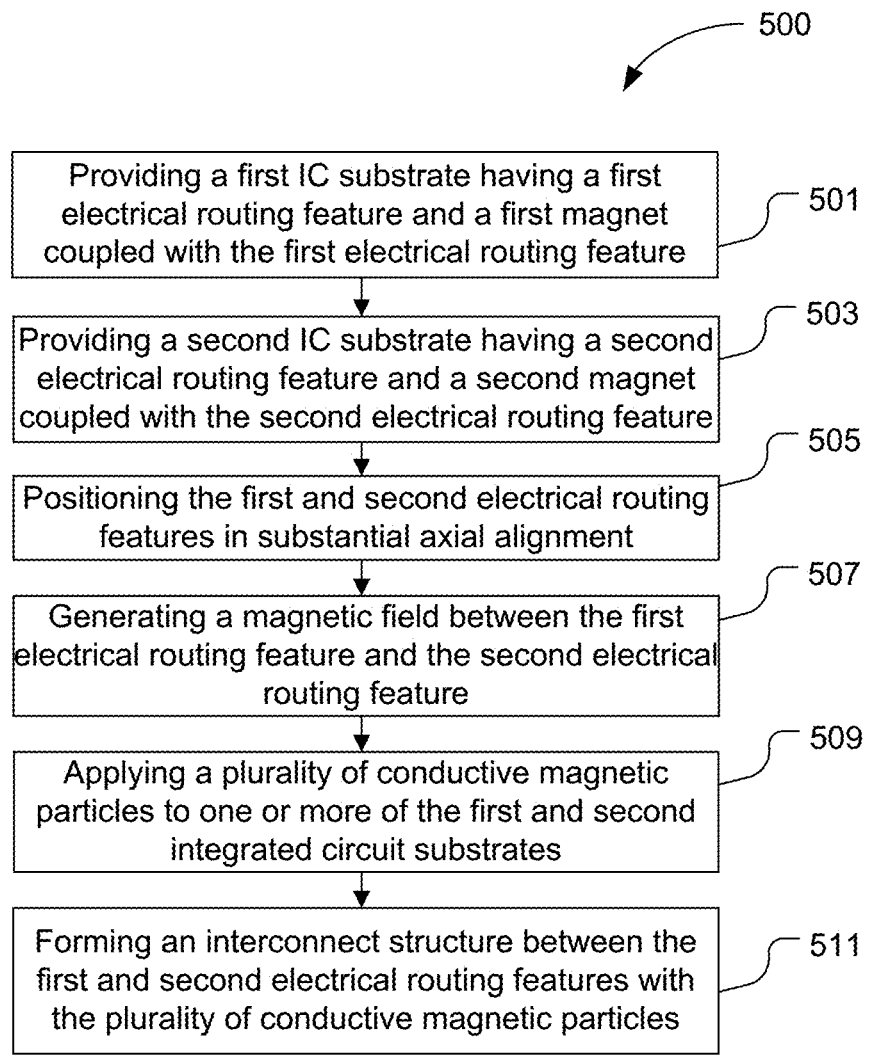
FIG. 5 schematically illustrates a flow diagram for a method of magnetically coupling IC substrates, in accordance with some embodiments.
Figure 6:
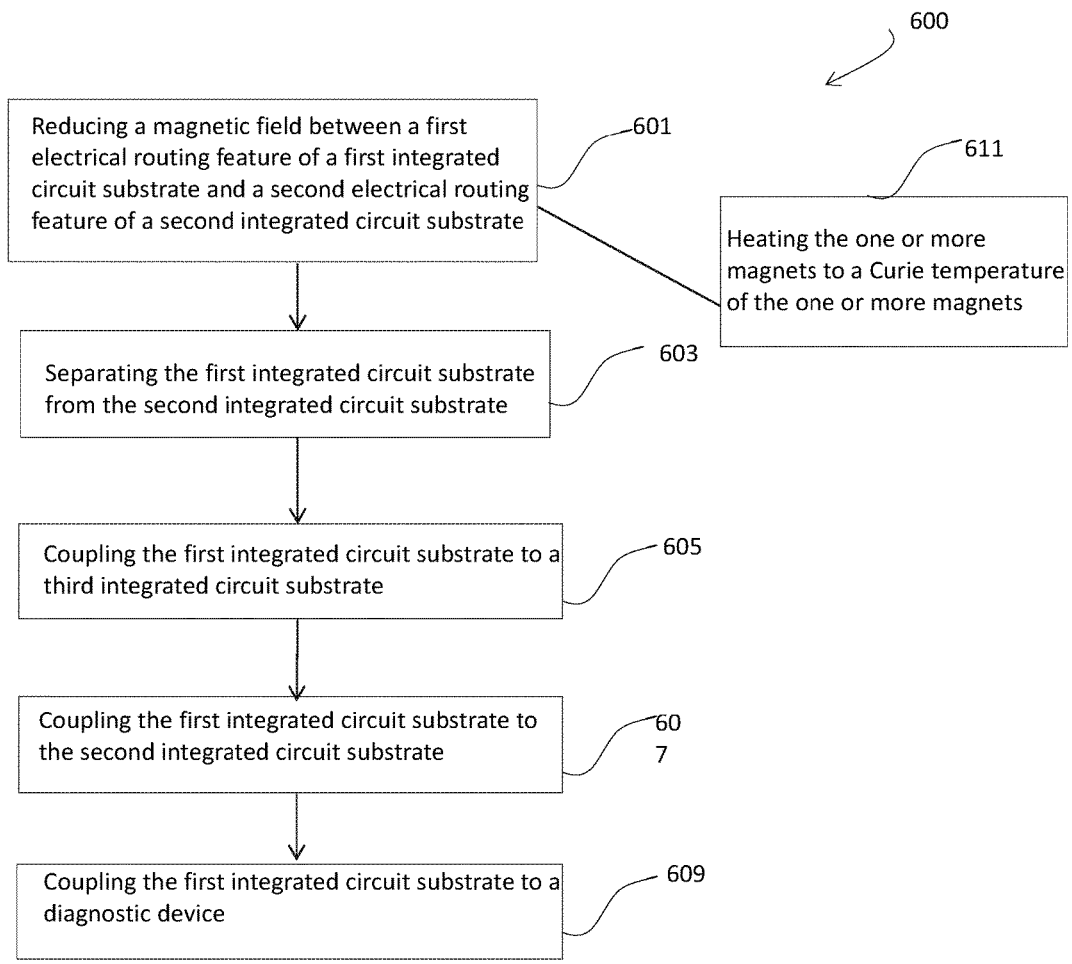
FIG. 6 schematically illustrates a flow diagram for a method of separating magnetically coupled IC substrates, in accordance with some embodiments.

FIG. 5 schematically illustrates a flow diagram for a method of magnetically coupling IC substrates, in accordance with some embodiments. FIG. 6 schematically illustrates a flow diagram for a method of separating magnetically coupled IC substrates, in accordance with some embodiments.

Referring first to FIG. 5, method 500 may begin at block 501 with providing a first IC substrate (e.g., first die 102*a*) having a first electrical routing feature (e.g., electrical routing feature 128) and a first magnet (e.g., magnet 158) coupled with the first electrical routing feature. At block 503, a second IC substrate (e.g., second die 102*b*) having a second electrical routing feature (e.g., electrical routing feature 138) and a second magnet (e.g., magnet 162) coupled with the second electrical routing feature may be provided. In various embodiments, the first and second IC substrates may be any combination of dies, package substrates, circuit boards, or other IC substrates. The electrical routing features may formed with any suitable electrically conductive material and in any suitable shape, as described herein.

At block 505, the first and second electrical routing features (e.g., electrical routing features 128 and 138) may be positioned in substantial axial alignment. For example, where the first and second electrical routing features include pillars, the IC substrates may be positioned such that corresponding pillars on each of the IC substrates are in substantial axial alignment and spaced apart by a gap.

At block 507, a magnetic field (e.g., magnetic field 156) may be generated between the first electrical routing feature and the second electrical routing feature. In some embodiments, generating the magnetic field may include coupling a first magnet (e.g., magnet 158) with the first electrical routing feature or the first IC substrate, and coupling a second magnet (e.g., magnet 162) with the second electrical routing feature or the second IC substrate. In some embodiments, generating the magnetic field may include embedding the first magnet into the first electrical routing feature or the first IC substrate and/or embedding the second magnet into the second electrical routing feature or the second IC substrate. In some embodiments, positioning the first and second electrical routing features in substantial axial alignment may include positioning the first and second magnets in substantial axial alignment. In various embodiments, generating the magnetic field may include positioning the first and second electrical routing features in substantial proximity such that corresponding first and second magnetic fields of the first and second magnets overlap along said gap.

At block 509, a plurality of conductive magnetic particles (e.g., magnetic particles 250) may be applied to one or more of the first and second IC substrates. In some embodiments, the conductive magnetic particles may be applied to one or more of the first and second electrical routing features. For example, the first/second IC substrate(s) may be dipped into a reservoir that contains the conductive magnetic particles, which may cling to the first/second electrical routing features due to magnetic attraction. Alternatively, the conductive magnetic particles may be sprayed or otherwise dispensed onto the first/second IC substrates. In some embodiments, the conductive magnetic particles may be dispensed into a space (e.g., space 124) between the first and second IC substrates. In other embodiments, the conductive magnetic particles may be dispensed into a gap (e.g., gap 172) between the first and second electrical routing features.

At block 511, an interconnect structure (e.g., interconnect structure 112, 120, 130) may be formed between the first and second electrical routing features with the plurality of conductive magnetic particles. In some embodiments, the conductive magnetic particles may self-align to form the interconnect structure. In various embodiments, the conductive magnetic particles may be provided with a solderable material (e.g., within or surrounding the conductive magnetic particles), and forming the interconnect structure may include heating the solderable material. In other embodiments, the interconnect structure may be formed at room/ambient temperature, and the conductive magnetic particles may be movably coupled together by the magnetic field.

In various embodiments, magnetic interconnect structures may be disrupted for purposes such as testing or reworking one or more of the IC substrates. Referring now to FIG. 6, a method 600 may be begin at block 601 with reducing a magnetic field (e.g., magnetic field 156) between a first electrical routing feature of a IC circuit substrate (e.g., electrical routing feature 128 of die 102*a*) and a second electrical routing feature of a second IC substrate (e.g., electrical routing feature 138 of second die 102*b*). In some embodiments, the magnetic field may be generated by a first magnet (e.g., magnet 158) coupled with the first electrical routing feature/IC substrate and a second magnet (e.g., magnet 162) coupled with the second electrical routing feature/IC substrate. In various embodiments, a plurality of conductive magnetic particles (e.g., magnetic particles 250) may be disposed in a gap (e.g., gap 172) between the first and second electrical routing features, and reducing the magnetic field may reduce a magnetic attraction between the conductive magnetic particles and the first and second electrical routing features.

In various embodiments, reducing the magnetic field may include heating the first/second magnet(s) to a PDT and/or Curie temperature of the first/second magnet(s). In some embodiments, one of the magnets may have a lower PDT/Curie temperature than the other magnet, and reducing the magnetic field may include heating the magnet with the lower of the two PDT/Curie temperatures to that MOT/Curie temperature. In other embodiments, the first and second magnets may have substantially the same PDT/Curie temperature, and reducing the magnetic field may include heating one or both of the magnets to that PDT/Curie temperature. In some embodiments, reducing the magnetic field may include heating the conductive magnetic particles to a PDT/Curie temperature of the conductive magnetic particles.

At block 603, the first IC substrate may be separated from the second IC substrate. In some embodiments, separating the first and second IC substrates may include physically pulling or pushing one of the IC substrates away from the other after reducing the magnetic field. In other embodiments, separating the first and second IC substrates may further include disconnecting a spacer and/or a conventional interconnect structure (e.g., solder) from one or more of the IC substrates.

At blocks 605, 607, and 609, the first IC substrate may be coupled to a third IC substrate (block 605), the second IC substrate (block 607), and/or a diagnostic device (block 609). In various embodiments, the second/third IC substrate may be a motherboard, a die/die stack, a computer, a mobile electronic device, or any other IC substrate. In some embodiments, the first IC substrate may be a chip card that is configured to be removable/replaceable without substantial damage.

In various embodiments, coupling the first IC substrate to any one or more of the third IC substrate, the second IC substrate, and the diagnostic device may include forming magnetic interconnect structures between the first IC substrate and that substrate/device. For example, in some embodiments, reducing the magnetic field may include heating the conductive magnetic particles to a PDT/Curie temperature of the conductive magnetic particles without heating the first/second magnet to the PDT/Curie temperature of the first/second magnet, and coupling the first IC substrate to the corresponding substrate/device may include forming a new magnetic interconnect with other conductive magnetic particles. In other embodiments, reducing the magnetic field may include heating the second magnet (of the second IC substrate) to a PDT/Curie temperature of the second magnet without heating the first magnet (of the first IC substrate) to the PDT/Curie temperature of the first magnet. The first IC substrate may then be coupled with the third IC substrate and/or diagnostic device by forming new magnetic interconnects with other conductive magnetic particles.

In various embodiments, reducing the magnetic field may include heating the second magnet to the PDT/Curie temperature of the second magnet, and coupling the first IC substrate with the second IC substrate may include forming conventional interconnects (e.g., solder, wire, etc.) between the first and second IC substrates. In other embodiments, reducing the magnetic field may include heating the first magnet to a PDT/Curie temperature of the first magnet, and coupling the first IC substrate with the second/third IC substrate and/or diagnostic device may include forming conventional interconnects (e.g., solder, wire, etc.) between the first IC substrate and the second/third IC substrate and/or diagnostic device. In still other embodiments, coupling the first IC substrate to any one or more other substrates/devices may include coupling additional magnets to the first/second/third IC substrates or diagnostic device and forming magnetic interconnect structures between the additional magnets.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 7:
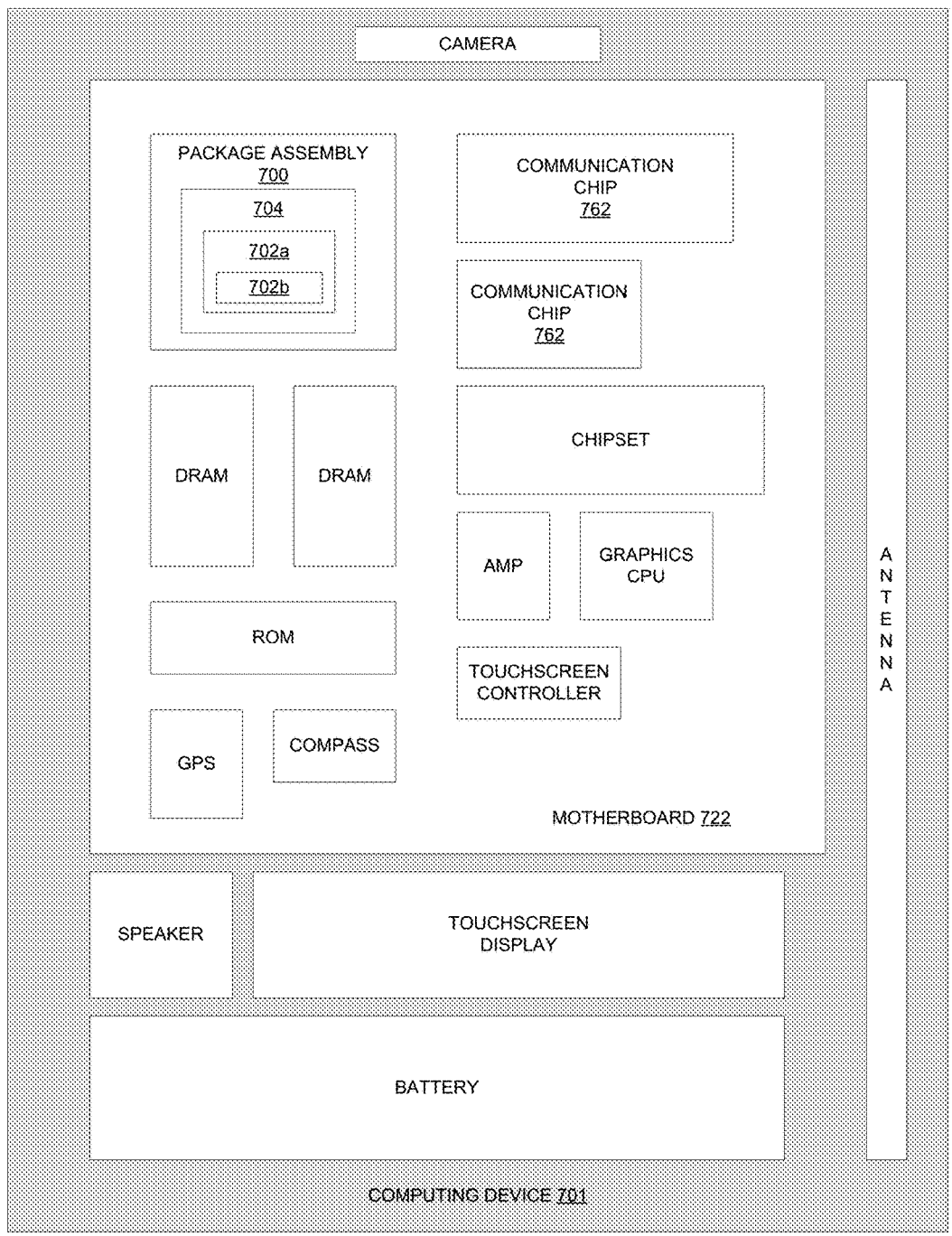
FIG. 7 schematically illustrates a computing device in accordance with various embodiments.

FIG. 7 illustrates an example computing device 701, in accordance with various embodiments. IC package assemblies as described herein may be installed on a computing/communicating device. For example, IC package assembly 700 may be installed on a computing device 701. IC package assembly 700 may include a first die 702a embedded in a package substrate 704 and a second die 702b coupled with the first die 702a. Components, features, and/or configurations of IC package assembly 700 may be as described herein with reference to IC package assembly 100 and components thereof.

The computing device 701 may house a circuit board such as motherboard 722. The motherboard 722 may include a number of components, including but not limited to IC package assembly 700 and at least one communication chip 762. The IC package assembly 700 may be physically and electrically coupled to the motherboard 722 (e.g., circuit board 122 of FIG. 1A). In some implementations, communication chip(s) 762 may also be physically and electrically coupled to the motherboard 722. In further implementations, the communication chip(s) 762 may be part of the IC package assembly 700. In various embodiments, at least one communication chip 762 may be physically and electrically coupled to IC package assembly 700. In further implementations, a communication chip 762 may be part of IC package assembly 700, e.g., as an additional die on or embedded in build-up layers in IC package assembly 700. For these embodiments, IC package assembly 700 and communication chip 762 may be disposed on the motherboard 722. In alternate embodiments, the various components may be coupled without the employment of motherboard 722.

In some embodiments, a die of IC package assembly 700 (e.g., first die 702a) may be a processor of the computing device 701. The term "processor" may refer to any device or portion of a device that processes electronic data from registers and/or memory to transform that electronic data into other electronic data that may be stored in registers and/or memory.

Depending on its applications, computing device 701 may include other components that may or may not be physically and electrically coupled to the motherboard 722. These other components include, but are not limited to, volatile memory (e.g., dynamic random access memory, also referred to as "DRAM"), non-volatile memory (e.g., read only memory, also referred to as "ROM"), flash memory, an input/output controller, a digital signal processor (not shown), a crypto processor (not shown), a graphics processor, one or more antenna, a display (e.g., a touch screen display), a touch screen controller, a battery, an audio codec (not shown), a video codec (not shown), a global positioning system ("GPS") device, a compass, an accelerometer (not shown), a gyroscope (not shown), a speaker, a camera, and a mass storage device (such as hard disk drive, a solid state drive, compact disk ("CD"), digital versatile disk ("DVD"))(not shown), and so forth. In various embodiments, various components may be integrated with other components to form a System on Chip ("SoC"). In further embodiments, some components, such as DRAM, may be embedded in or within IC package assembly 700.

The communication chip(s) 762 may enable wired and/or wireless communications for the transfer of data to and from the computing device 701. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 762 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 762 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 762 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 762 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 762 may operate in accordance with other wireless protocols in other embodiments.

The computing device 701 may include a plurality of communication chips 762. For instance, a first communication chip 762 may be dedicated to shorter range wireless communications such as Wi-Fi and Bluetooth and a second communication chip 762 may be dedicated to longer range wireless communications such as GPS, EDGE, GPRS, CDMA, WiMAX, LTE, Ev-DO, and others.

In various implementations, the computing device 701 may be a laptop, a netbook, a notebook, an ultrabook, a smart phone, a computing tablet, a personal digital assistant ("PDA"), an ultra mobile PC, a mobile phone, a desktop computer, a server, a printer, a scanner, a monitor, a set-top box, an entertainment control unit (e.g., a gaming console), a digital camera, a portable music player, a digital video recorder, or a digital watch. In further implementations, the computing device 701 may be any other electronic device that processes data. In some implementations, the computing device 701, IC package assembly 700, and/or components thereof may be incorporated into an electronic device designed to be worn on the body of a human. In other implementations, the IC package assembly 700 or components thereof may be incorporated into a removable chip card.

EXAMPLES

Various embodiments of IC package assemblies with magnetic interconnect structures, methods for fabricating such IC package assemblies and magnetic interconnect structures, and systems incorporating IC substrates coupled by magnetic interconnect structures are described herein. In various embodiments, an apparatus may comprise a first integrated circuit (IC) substrate having a first electrical routing feature and a first magnet coupled with the first electrical routing feature, a second integrated circuit (IC) substrate having a second electrical routing feature and a second magnet coupled with the second electrical routing feature, and an interconnect structure coupled with the first and second electrical routing features. In various embodiments, the interconnect structure may comprise a plurality of magnetic particles, and the first magnet and the second magnet may be configured to generate a magnetic field between the first magnet and the second magnet. In various embodiments, the magnetic particles may be electrically conductive and disposed in the magnetic field. In various embodiments, the magnetic particles may be movably coupled together, and the interconnect structure may be pliable. In various embodiments, the magnetic particles may have an electrically conductive outer portion and a magnetic interior portion. In various embodiments, the first magnet may be embedded in the first integrated circuit substrate.

In various embodiments, the first magnet may be disposed within the first electrical routing feature. In various embodiments, the first electrical routing feature may comprise a first pillar having a base portion adjacent to the first IC substrate and a top portion distal to the first IC substrate, and the second electrical routing feature may comprise a second pillar having a base portion adjacent to the second IC substrate and a top portion distal to the second IC substrate. In various embodiments, the first magnet may be disposed within the base portion of the first pillar, and the second magnet may be disposed within the base portion of the second pillar. In various embodiments, the first magnet may be disposed within the top portion of the first pillar, and the second magnet may be disposed within the top portion of the second pillar. In various embodiments, the first magnet may extend in a first lengthwise dimension from the base portion of the first pillar to the top portion of the first pillar, the second magnet may extend in a second lengthwise dimension from the base portion of the second pillar to the top portion of the second pillar, the first lengthwise dimension may be a largest dimension of the first magnet, and the second lengthwise dimension may be a largest dimension of the second magnet. In various embodiments, the first IC substrate may have a third electrical routing feature comprising a third pillar, a third magnet in the third pillar, and a fourth magnet disposed in the first IC substrate, and the fourth magnet may be magnetically coupled with the first magnet and the third magnet.

In various embodiments, the first integrated circuit substrate may include a die. In various embodiments, the second integrated circuit substrate may include another die, an interposer, or a package substrate. In various embodiments, the apparatus may further comprise a spacer disposed between the first and second integrated circuit substrates, and the spacer may be configured to maintain a minimum distance between the first and second integrated circuit substrates. In various embodiments, the first and second electrical routing features may be spaced apart by a gap, and the plurality of magnetic particles may form a conductive bridge across the gap from the first electrical routing feature to the second electrical routing feature. In various embodiments, the gap may have a height and the magnetic particles may have an average diameter in the range of 0.1% to 10% of the height of the gap. In various embodiments, the apparatus may comprise a fluid disposed between the first and second integrated circuit substrates, and the fluid may at least partially surround the interconnect structure. In various embodiments, the magnetic particles may have an electrically conductive outer portion and a magnetic interior portion. In various embodiments, the first electrical routing feature may include a plurality of first electrical routing features, the first magnet may include a plurality of first magnets coupled with corresponding ones of the plurality of first electrical routing features, and the first magnets may be arranged to form a checkerboard pole orientation pattern. In various embodiments, the first electrical routing feature may include a plurality of first electrical routing features, the first magnet may include a plurality of first magnets coupled with corresponding ones of the plurality of first electrical routing features, and the first magnets may be arranged to form an alternating row pole orientation pattern.

In various embodiments, a method may comprise generating a magnetic field between a first electrical routing feature of a first integrated circuit substrate and a second electrical routing feature of a second integrated circuit substrate, wherein the magnetic field extends across a gap between the first and second electrical routing features, and forming an interconnect structure between the first and second electrical routing features. In various embodiments, generating the magnetic field may include magnetizing the first and second electrical routing features. In various embodiments, the interconnect structure may comprise a plurality of conductive magnetic particles. In various embodiments, one or more of the first integrated circuit substrate and the second integrated circuit substrate may include a die. In various embodiments, generating the magnetic field may include embedding a first magnet into the first electrical routing feature or the first integrated circuit substrate and embedding a second magnet into the second electrical routing feature or the second integrated circuit substrate. In various embodiments, generating the magnetic field may include positioning the first and second electrical routing features in substantial axial alignment such that corresponding first and second magnetic fields of the first and second electrical routing features overlap along said gap. In various embodiments, forming the interconnect structure between the first and second electrical routing features may include applying the plurality of conductive magnetic particles to one or more of the first and second integrated circuit substrates. In various embodiments, forming the interconnect structure between the first and second electrical routing features may include dispensing the plurality of conductive magnetic particles into a gap between the first and second integrated circuit substrates.

In various embodiments, a method may comprise reducing a magnetic field between a first electrical routing feature of a first integrated circuit substrate and a second electrical routing feature of a second integrated circuit substrate, and separating the first integrated circuit substrate from the second integrated circuit substrate. In various embodiments, a plurality of conductive magnetic particles may be disposed in a gap between the first and second electrical routing features, and reducing the magnetic field may reduce a magnetic attraction between the conductive magnetic particles and the first and second electrical routing features.

In various embodiments, the first and second integrated circuit substrates may include one or more magnets coupled with the first and second electrical routing features, and reducing the magnetic field may include heating the one or more magnets to a Curie temperature of the one or more magnets. In various embodiments, the first and second integrated circuit substrates may include one or more magnets coupled with the first and second electrical routing features, and reducing the magnetic field may include heating the one or more magnets to a partial demagnetization temperature (PDT) of the one or more magnets. In various embodiments, the first and second integrated circuit substrates may include one or more magnets coupled with the first and second electrical routing features, and reducing the magnetic field may include heating the conductive magnetic particles to a Curie temperature of the one or more magnets. In various embodiments, the first and second integrated circuit substrates may include one or more magnets coupled with the first and second electrical routing features, and reducing the magnetic field may include heating the conductive magnetic particles to a partial demagnetization temperature (PDT) of the one or more magnets. In various embodiments, the method may further include coupling the first electrical routing feature of the first integrated circuit substrate with a third electrical routing feature of a third integrated circuit substrate after separating the first integrated circuit substrate from the second integrated circuit substrate. In various embodiments, one or more of the first integrated circuit substrate and the second integrated circuit substrate may include a die.

In various embodiments, a system may comprise a circuit board and a package assembly coupled with the circuit board, and the package assembly may include a first integrated circuit substrate having a first electrical routing feature and a first magnet coupled with the first electrical routing feature, a second integrated circuit substrate having a second electrical routing feature and a second magnet coupled with the second electrical routing feature, and an interconnect structure coupled with the first and second electrical routing features, and the interconnect structure may comprise a plurality of magnetic particles. In various embodiments, the magnetic particles may be electrically conductive. In various embodiments, the magnetic particles may be movably coupled together and the interconnect structure may be pliable. In various embodiments, one or more of the integrated circuit substrates may include a die. In various embodiments, the system may be embodied in an electronic device configured to be worn on a body. In various embodiments, the first electrical routing feature may include a plurality of first electrical routing features, the first magnet may include a plurality of first magnets coupled with corresponding ones of the plurality of first electrical routing features, and the first magnets may be arranged to form a checkerboard pole orientation pattern. In various embodiments, the first electrical routing feature may include a plurality of first electrical routing features, the first magnet may include a plurality of first magnets coupled with corresponding ones of the plurality of first electrical routing features, and the first magnets may be arranged to form an alternating row pole orientation pattern.

Various embodiments may include any suitable combination of the above-described embodiments. Furthermore, some embodiments may include one or more non-transitory computer-readable media having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method, comprising:
    embedding a first magnet into a first integrated circuit substrate, or a first electrical routing feature of the first integrated circuit substrate;
    generating a magnetic field between the first electrical routing feature of the first integrated circuit substrate and a second electrical routing feature of a second integrated circuit substrate, wherein the magnetic field extends across a gap between the first and second electrical routing features; and
    forming an interconnect structure between the first and second electrical routing features, wherein the interconnect structure comprises a plurality of conductive magnetic particles.

2. The method of claim 1, wherein one or more of the first integrated circuit substrate and the second integrated circuit substrate includes a die.

3. The method of claim 2, wherein generating the magnetic field includes embedding a second magnet into the second electrical routing feature or the second integrated circuit substrate.

4. The method of claim 3, wherein generating the magnetic field includes positioning the first and second electrical routing features in substantial proximity such that corresponding first and second magnetic fields of the first and second magnets overlap along said gap.

5. The method of claim 1, wherein forming the interconnect structure between the first and second electrical routing features includes applying the plurality of conductive magnetic particles to one or more of the first and second integrated circuit substrates.

6. The method of claim 1, wherein forming the interconnect structure between the first and second electrical routing features includes dispensing the plurality of conductive magnetic particles into a gap between the first and second integrated circuit substrates.

7. A method comprising:
reducing a magnetic field between a first electrical routing feature of a first integrated circuit substrate and a second electrical routing feature of a second integrated circuit substrate, wherein the magnetic field is generated by a first magnet disposed within the first integrated circuit substrate, or the first electrical routing feature, a plurality of conductive magnetic particles are disposed in a gap between the first and second electrical routing features and reducing the magnetic field reduces a magnetic attraction between the conductive magnetic particles and the first and second electrical routing features; and
separating the first integrated circuit substrate from the second integrated circuit substrate.

8. The method of claim 7, wherein the second integrated circuit substrate includes one or more magnets coupled with the second electrical routing features, and reducing the magnetic field includes heating the one or more magnets to a Curie temperature of the one or more magnets.

9. The method of claim 7, wherein one or more of the first integrated circuit substrate and the second integrated circuit substrate includes a die.

* * * * *